United States Patent
Bevk

(10) Patent No.: US 6,566,181 B2
(45) Date of Patent: *May 20, 2003

(54) PROCESS FOR THE FABRICATION OF DUAL GATE STRUCTURES FOR CMOS DEVICES

(75) Inventor: Joze Bevk, Summit, NJ (US)

(73) Assignee: Agere Systems Inc., Allentown, PA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,028

(22) Filed: Feb. 26, 1999

(65) Prior Publication Data

US 2002/0028542 A1 Mar. 7, 2002

(51) Int. Cl.⁷ ......................................... H01L 21/8238
(52) U.S. Cl. ................... 438/199; 438/201; 438/205; 438/207
(58) Field of Search .................. 438/199, 201, 438/205, 207

(56) References Cited

U.S. PATENT DOCUMENTS

| | | | | |
|---|---|---|---|---|
| 4,622,573 A | * | 11/1986 | Bakeman, Jr. et al. | 357/42 |
| 5,081,066 A | | 1/1992 | Kim | |
| 5,147,820 A | | 9/1992 | Chittipeddi et al. | |
| 5,258,645 A | * | 11/1993 | Sato | 257/637 |
| 5,355,010 A | * | 10/1994 | Fuji et al. | 257/377 |
| 5,362,670 A | * | 11/1994 | Iguchi et al. | 437/70 |
| 5,411,899 A | * | 5/1995 | Lee et al. | 437/34 |
| 5,413,944 A | * | 5/1995 | Lee | 437/34 |
| 5,464,783 A | * | 11/1995 | Kim et al. | 437/42 |
| 5,464,789 A | | 11/1995 | Saito | |
| 5,480,828 A | * | 1/1996 | Hsu et al. | 437/56 |
| 5,573,963 A | * | 11/1996 | Sung | 437/34 |
| 5,648,287 A | * | 7/1997 | Tsai et al. | 437/44 |
| 5,712,181 A | | 1/1998 | Byun et al. | |
| 5,759,886 A | | 6/1998 | Chung | |
| 5,763,922 A | * | 6/1998 | Chau | 257/371 |
| 5,770,494 A | | 6/1998 | Yamamoto et al. | |
| 5,851,922 A | | 12/1998 | Bevk et al. | |
| 5,918,133 A | * | 6/1999 | Gardner et al. | 438/299 |
| 5,929,493 A | * | 7/1999 | Wu | 257/369 |
| 5,963,802 A | * | 10/1999 | Wu | 438/228 |
| 6,017,787 A | * | 1/2000 | Chittipeddi et al. | 438/228 |
| 6,121,124 A | * | 9/2000 | Liu | 438/587 |
| 6,156,591 A | * | 12/2000 | Wu | 438/199 |

OTHER PUBLICATIONS

Stanley Wolf, Silicon Processing for the ULSI Era, vol. 2 pp. 38, 199–200, 238 & 540; 1990.*
Silicon Processing for the VLSI Era, vol. II, pp. 68–69.*
S. Wolf and R.N. Tauber, Refractory Metals and Their Silicides in VLSI Fabrication, 1985, IEEE, pp. 397–399.

* cited by examiner

Primary Examiner—Wael Fahmy
Assistant Examiner—Shrinivas H Rao
(74) Attorney, Agent, or Firm—Lowenstein Sandler PC

(57) ABSTRACT

In accordance with the invention, a process for forming a dual gate structure for CMOS devices comprises the steps of a) providing a semiconductor workpiece including n-type and p-type regions and a gate dielectric region for a dual gate structure formed over the regions, b) forming over the gate dielectric region a thin layer of semiconductor doped to one type of conductivity, c) selectively removing the doped semiconductor overlying the workpiece region of like conductivity doping and d) forming a thin layer of semiconductor doped to the opposite kind of conductivity. The doped layers are then planarized as by chemical-mechanical polishing (CMP). An additional layer of undoped semiconductor can optionally be applied to bury the doped layers, and the device can be finished by coating with metal silicide in the usual fashion. This process can be completed with only one photolithography step, simplifying device fabrication by several operations.

6 Claims, 3 Drawing Sheets

US 6,566,181 B2

PROCESS FOR THE FABRICATION OF DUAL GATE STRUCTURES FOR CMOS DEVICES

FIELD OF THE INVENTION

This invention relates to fabrication of integrated circuits, and in particular, to the fabrication of dual gate structures for CMOS devices.

BACKGROUND OF THE INVENTION

A variety of applications utilize CMOS (Complimentary Metal Oxide Semiconductor) integrated circuits containing a dual-gate structure. FIG. 1 illustrates a structure used in making CMOS circuits. This structure comprises a silicon substrate 100 including an n-doped region 102 and an adjacent p-doped region 104. A gate dielectric region 108 overlies regions 102 and 104, and a field dielectric 106 is disposed overlying the boundary of regions 102 and 104 to assist in their isolation. A polysilicon gate region 110 overlies the gate dielectric, and a metal silicide region 112 is formed on the polysilicon gate to enhance conductivity.

Typically, fabrication of a dual-gate structure begins by forming a field dielectric region 106 over the boundary between n-doped region 102 and a p-doped region 104. (A dielectric material is an electrically insulating material, i.e., a material having a resistivity of about $10^6$ ohm-cm or greater.) The field dielectric 106 isolates the oppositely-doped regions of the device. The gate dielectric region 108 is then formed over regions 102 and 104. The polysilicon region 110 is typically deposited over the gate dielectric 108 and field dielectric 106. The portion of the polysilicon 110 overlying the n-doped region 102 is provided with a p-type dopant such as boron or $BF_2$, and the portion of the polysilicon 110 overlying the p-doped region 104 is provided with an n-type dopant such as phosphorus or arsenic. The refractory metal silicide layer is typically formed by the silicide process (direct deposit of metal silicide) or the salicide process (deposit of metal followed by heating).

A difficulty in the fabrication of such structures is that n-type and p-type dopants tend to diffuse more readily in refractory metal silicides than in polysilicon. Dopants thus tend to diffuse, for example, from a region of the polysilicon 110 overlying doped silicon region 102 into the silicide layer 112, laterally in the silicide layer 112, and then back into the polysilicon 110 at a region overlying the oppositely-doped region 104. Thus, n-type dopants move into a p-doped polysilicon region and vice versa. This phenomenon, referred to as cross-doping, causes undesirable shifts in threshold voltage, an important parameter in CMOS design and operation. Moreover, the problem of cross-doping is becoming more severe as the industry moves toward smaller CMOS devices. The smaller the devices, the larger the effect of cross-dopants on properties such as threshold voltage, and the closer the devices, the less distance the dopants have to laterally travel to interfere with adjacent devices.

Problems are also created by the distribution of dopants in the implanted regions of the polysilicon 110. Advantageously, the implanted dopants in the final device are located near the underlying gate dielectric 108. Typically, however, the majority of dopants lie close to the top of the polysilicon 110, and an anneal is used to diffuse the dopants toward the gate dielectric 108. However, the anneal time and temperature required to diffuse the dopants across this distance will often undesirably allow diffusion of some of the dopants laterally within the polysilicon 110 into an oppositely-doped region of the polysilicon 110, causing cross-doping. This lateral diffusion within the polysilicon 110 is a problem regardless of whether a silicide layer is present. This mechanism of cross-doping is particularly problematic where half the distance between the active regions of adjacent devices becomes comparable to the thickness of the doped regions of the polysilicon 110. In addition, the use of thinner gate dielectric layers improves device performance, but only where a relatively large concentration of dopants, advantageously about $10^{20}$ dopants/$cm^3$ or greater, is located adjacent to the gate dielectric (resulting in what is known in the art as low poly-depletion). If sufficient dopants are not located adjacent to the dielectric layer, the use of a thinner gate dielectric will at best only marginally improve device performance.

It is also possible for dopant distribution to cause problems when forming a refractory metal silicide by a salicide process. Growth of the silicide layer in the salicide process is detrimentally affected if too many dopants, or dopant-based precipitates, are located in the top region of the polysilicon gate structure, where the silicide is formed. In addition, because the polysilicon region is typically thicker when using a salicide process, the dopant diffusion distance to the gate dielectric is often increased, thereby allowing encroachment of the underlying channel region that often leads to shorts in the device.

A process that places dopants deep within the polysilicon layer is desired. However, such a deep implant is difficult to attain. Typically, the majority of dopants will lie close to the top surface of the polysilicon regions. It is difficult to implant dopants deeper in the polysilicon without encountering undesirable effects. For example, it is possible for dopants, particularly boron, to penetrate the polysilicon during ion implantation and move into the underlying silicon substrate, or to move along certain crystallographic orientations of polysilicon—a phenomenon known as channeling. (Both mechanisms are referred to herein generally as penetration.) The presence of the boron in the channel region of the silicon substrate detrimentally affects the threshold voltage. Thus, implantation is performed at energies low enough to reduce penetration. Yet, where lower implantation energies are used, the concentration profile will often not be deep enough to avoid the problems discussed above.

An improved process is described in applicant's copending application Ser. No. 08/902,044, filed on Jul. 29, 1997 and entitled "Process for Device Fabrication". In essence, devices are prepared by forming a first, relatively thin (e.g., about 300–1000 Å) amorphous silicon region over the gate dielectric region. An n-type dopant is implanted at a first portion of the first amorphous silicon region, typically over the p-type region of the substrate. The n-type dopant is advantageously implanted such that substantially all of the dopant remains in the first amorphous silicon region and does not penetrate into the underlying dielectric region or the substrate. A p-type dopant species is then implanted at a second portion of the first amorphous silicon region, typically over the n-type region of the substrate.

Once the desired dopants are implanted into the first silicon region, a second amorphous silicon (or polysilicon) region is formed over the first silicon region, in essence burying the implanted dopants. Typically, a refractory metal silicide layer is formed over the second amorphous silicon region. Devices are then formed on the structure in accordance with conventional processing techniques known to one skilled in the art.

The creation of the buried implant layer hinders cross-doping that occurs through the silicide. In order for such detrimental cross-doping to occur, the dopant must diffuse from the p-doped region of the first amorphous silicon region into and through the second amorphous silicon region into the metal silicide layer, diffuse laterally within the silicide layer to the area over the oppositely-doped amorphous silicon region, diffuse back through the second amorphous silicon region into the opposite-doped region of the first amorphous silicon region, and move through the first amorphous silicon region to an area along the underlying gate dielectric.

While this process works well, it involves two implantations, each of which requires a separate photolithography step. Each photolithography requires several different operations to complete. It would be advantageous to have a new process providing protection from cross doping which involved fewer operations.

SUMMARY OF THE INVENTION

In accordance with the invention, a process for forming a dual gate structure for CMOS devices comprises the steps of a) providing a semiconductor workpiece including n-type and p-type regions and a gate dielectric region for a dual gate structure formed over the regions, b) forming over the gate dielectric region a thin layer of semiconductor doped to one type of conductivity, c) selectively removing the doped semiconductor overlying the workpiece region of like conductivity doping and d) forming a thin layer of semiconductor doped to the opposite kind of conductivity. The doped layers are then planarized as by chemical-mechanical polishing (CMP). An additional layer of undoped semiconductor can optionally be applied to bury the doped layers, and the device can be finished by coating with metal silicide in the usual fashion. This process can be completed with only one photolithography step, simplifying device fabrication by several operations.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
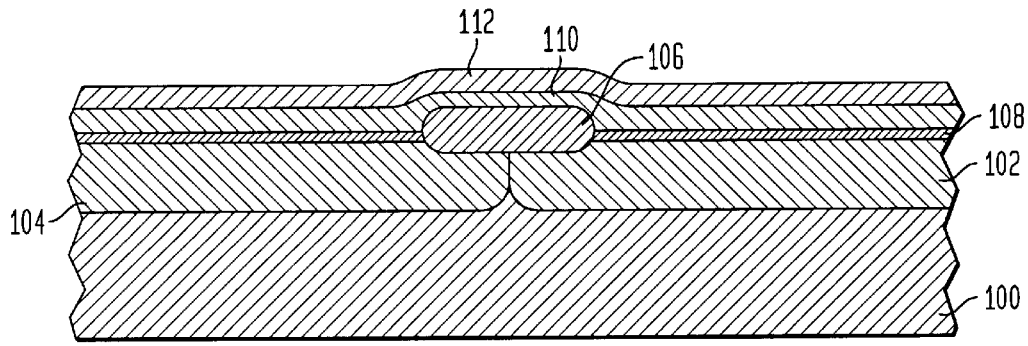
FIG. 1, which is prior art, is a schematic cross section of a typical structure for making a CMOS device.

Referring to the drawings, FIG. 1 is a schematic cross section of a dual gate structure to be fabricated and is described above in the Background of the Invention.

Figure 2:
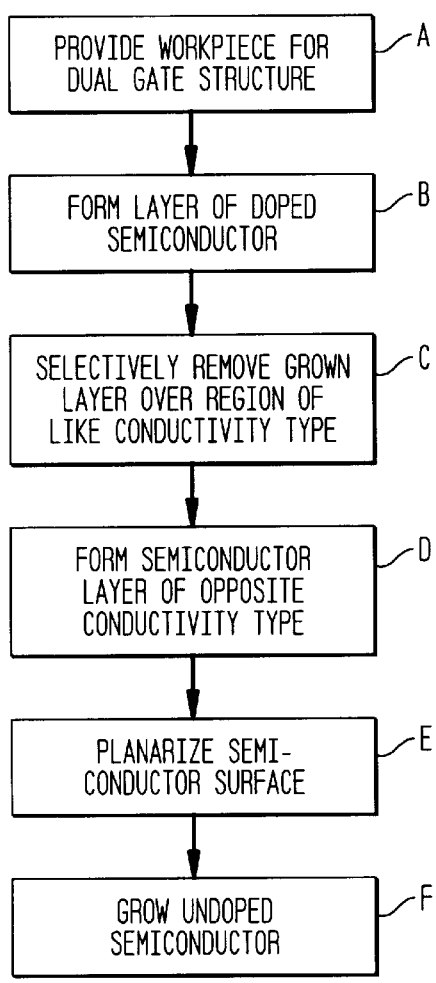
FIG. 2 is a flow chart of the steps involved in fabricating a dual gate structure in accordance with the invention.
Figure 3A:
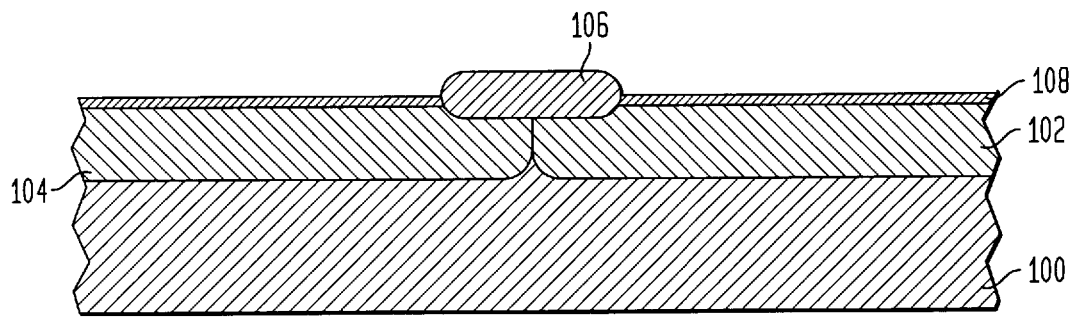
FIGS. 3A–3E illustrate the dual gate structure at various stages of the fabrication process of FIG. 2.

FIG. 2 is a flow diagram of the steps in fabricating a dual gate structure. As shown in block A of FIG. 2, the first step is to provide a workpiece for a dual gate structure including the n-type and p-type regions and the overlying gate dielectric regions. FIG. 3A schematically illustrates such a workpiece comprising a semiconductor substrate 100, n-type region 102, adjacent p-type region 104 and dielectric regions 106, 108. Dielectric region 106 is a field dielectric and region 108 is a gate dielectric. Field dielectric 106 is formed overlying the boundary between the n-type region 102 and the p-type region 104. Field dielectric 106 constitutes, for example, a surface isolation region or a trench isolation region. Typically, the field dielectric 106 is a shallow trench isolation region and has a thickness of about 1200 to about 3000 Å. Advantageously, the semiconductor is silicon. These regions can be formed in accordance with standard processing techniques well known in the art, such as the twin tub process described in U.S. Pat. No. 4,435,596 to Parillo et al., the disclosure of which is hereby incorporated by reference.

The gate dielectric region 108 is typically silicon dioxide formed over the portions of the n-type region 102 and p-type region 104 not covered by the field dielectric 106. The gate dielectric 108 is formed in accordance with standard processing techniques and, when formed from silicon dioxide, is advantageously about 15 to about 100 Å thick. The combination of the field dielectric 106 and gate dielectric 108 can be considered a single dielectric material region.

The next step shown in Block B of FIG. 2 is to form over the gate dielectric region a thin layer of doped semiconductor. The semiconductor can be amorphous silicon. It typically has a thickness in the range 300–2000 Å. Preferably the semiconductor is grown with in situ doping of one type of conductivity, preferably n-type, with a concentration in the range $10^{20}$–$10^{21}$ atoms/cm$^3$. The n-type semiconductor can be grown over both the underlying p-type region of the workpiece and the underlying n-type region. It is noteworthy that in the growth of in situ doped silicon, the initially deposited silicon (e.g. the first 50–200 angstroms, is substantially free of dopant). Methods for growing thin layers in in situ doped semiconductors are well known in the art. See, for example, U.S. Pat. No. 5,607,511 issued to B. Meyerson on Mar. 4, 1997 and U.S. Pat. No. 5,256,566 issued to D. Baily on Oct. 26, 1993, both of which are incorporated herein by reference. Alternatively, the semiconductor can be grown as an undoped layer and subsequently be doped, as by ion implantation.

The third step (Block C) is to selectively remove the grown, doped semiconductor overlying the workpiece region of like conductivity doping. In the present example, this involves masking the n-type silicon overlying the p-type region and selectively removing the n-type semiconductor overlying the n-type region 102, as by wet etching or reactive ion etching. The mask is conveniently formed of photoresist using conventional photolithgraphic techniques.

It should be noted that this step does not require removal of all semiconductor overlying the n-type region. Only the upper portion of the layer containing dopant need be removed. A small undoped thickness can be left to protect the gate dielectric region.

Figure 3B:
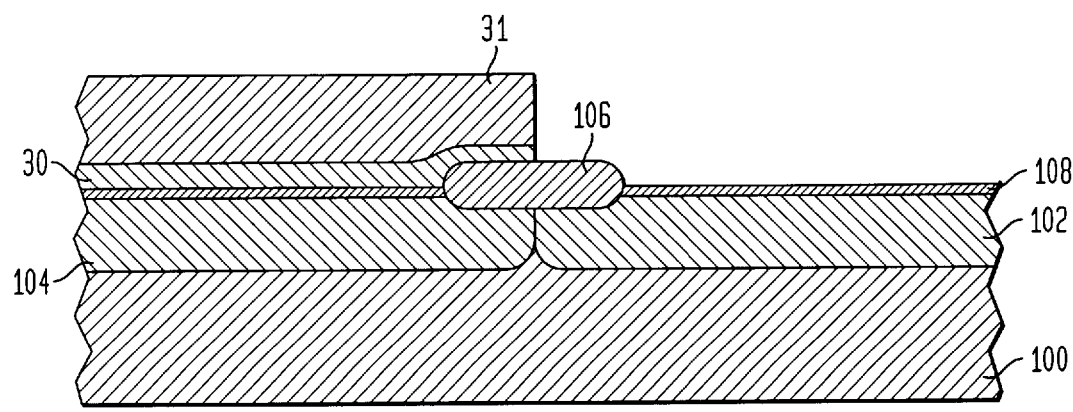

FIG. 3B shows the structure with the top (doped) portion of the in situ doped semiconductor layer 30 removed over the n-doped region of the workpiece. The semiconductor layer over the p-doped region 104 is protected from removal by mask 31.

The next step shown in Block D of FIG. 2 is to form over the surface a thin layer of semiconductor doped to the opposite kind of conductivity, e.g. p-type silicon. As a preliminary step, the mask 31 is removed. Then the new doped layer is formed overlying both regions 102 and 104. It is noteworthy that no photolithography is required. The layer can be formed by growing an in situ layer or by growing an undoped layer and implanting a dopant. Typical thickness is in the range 300–2000 Å and typical doping concentration is $10^{20}$–$10^{21}$ atoms/cm$^3$.

Figure 3C:
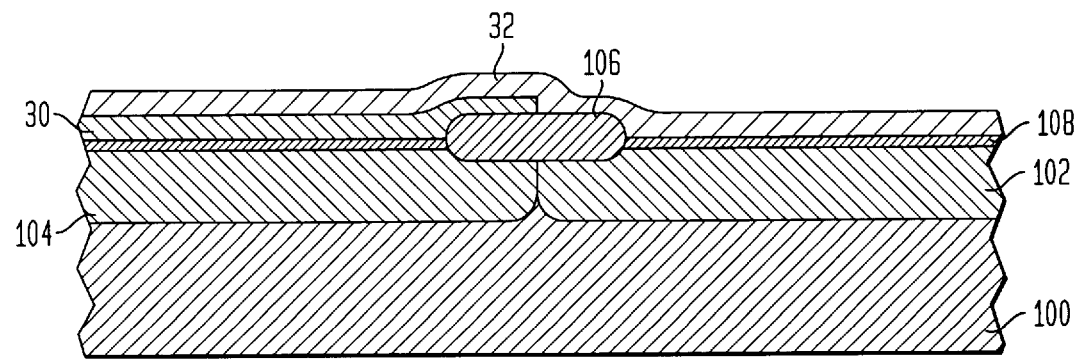

FIG. 3C illustrates the workpiece structure after the formation of the p-doped layer 32.

The fifth step (Block E) is to planarize the surface. This is conveniently accomplished by chemical-mechanical polishing (CMP).

Figure 3D:
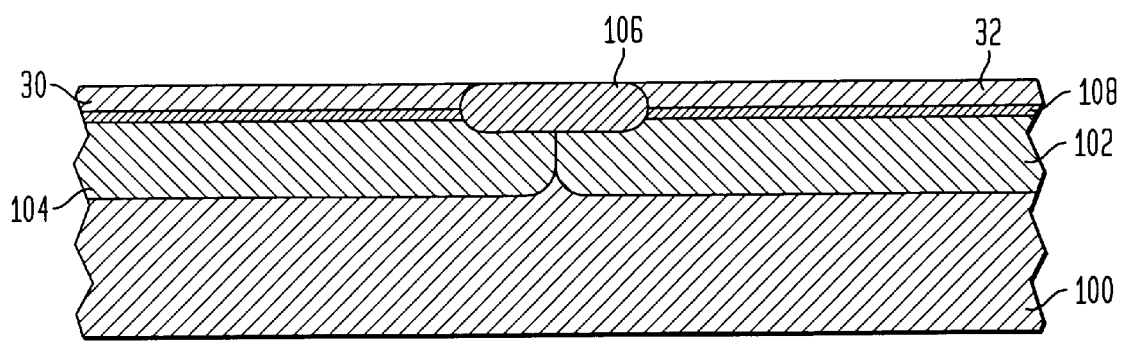

FIG. 3D shows the structure after planarizing. The planaization effectively removes the portion of p-doped layer 32 overlying region 104 without lithography. After planarization, the doped layers 30, 32 overlying regions overlying regions 102, 104 are of respectively opposite conductivity type.

The final step (Block F), which is optional, is to grow an additional undoped layer of semiconductor over the two doped layers to form the remaining thickness of the gate electrodes. Typical undoped silicon thicknesses are in the range 100–500 Å.

Figure 3E:
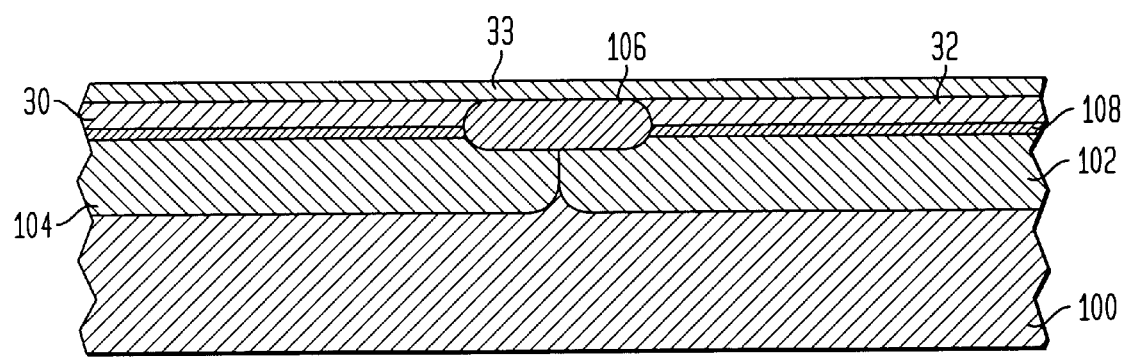

FIG. 3E shows the structure after this step. Doped semiconductor layers 30, 32 on the gate dielectric overlie crystalline regions of opposite conductivity and undoped semiconductor layer 33 is formed on both layers 30 and 32.

The device is then finished in the conventional manner. This typically involves partitioning the layer 33 to define separate gate electrodes and forming a metal silicide layer on the silicon gate to enhance conductivity.

The resulting structure is as shown in FIG. 1. A refractory metal silicide layer 112 is optionally formed on the grown silicon region 110 (33 of FIG. 3D) by standard processing techniques such as sputtering or chemical vapor deposition. Examples of suitable refractory metal silicides include tungsten silicide, tantalum silicide, and cobalt silicide. Advantageously, the refractory metal silicide layer has a thickness of about 800 to about 2000 Å. It is also advantageous to introduce nitrogen into the refractory metal silicide layer. Where the nitrogen is ion implanted, the implantation advantageously is performed at an energy of about 10–50 keV (depending on the thickness), more advantageously 30 keV, and at a dopant implant dose of about $1 \times 10^{15}$ to about $2 \times 10^{15}$ atoms/cm$^2$. The nitrogen appears to trap boron atoms in the silicide layer, and thus assists in reducing lateral diffusion and cross-doping of boron. See U.S. Pat. No. 5,851,922 issued to J. Bevk et al. on Dec. 22, 1998. It is also possible to form a silicide layer by a salicide process. Metal layers other than refractory metal silicides are also possible.

Advantageously, when the semiconductor is silicon, an anneal is performed after formation of the second amorphous silicon region 33 to recrystallize the second amorphous silicon region 33 and first amorphous silicon regions 30, 32, i.e., to transform the regions 30, 32, 33 into polysilicon. It is possible for the anneal to be performed after formation of the second silicon region 33, after formation of the silicide layer 34, or after a nitrogen implant of the silicide layer. The anneal is advantageously performed at a temperature of about 580 to about 650° C., for about 1 to about 5 hours, in a nitrogen atmosphere. More advantageously, the anneal is performed at about 650° C. for about 3 hours in a nitrogen atmosphere.

The resulting structure is then subjected to processing steps to form gate stacks over the n-regions and p-regions of the substrate, in accordance with standard procedures known in the art. Advantageously, such steps include a rapid thermal anneal after formation of gate stacks. The rapid thermal anneal is advantageously performed such that the wafer is raised to a temperature of about 900 to about 1050° C. for 2 to about 10 seconds. More advantageously, the wafer is raised to a temperature of 1000° C. for 5 seconds. The rapid thermal anneal is useful in attaining a desirable distribution of dopants in the doped regions of the device.

Typical processing steps subsequent to formation and implantation of refractory silicide layer 34 would include the following:

Deposit of a gate hard mask. The mask is formed, for example, from silicon oxide deposited by plasma-enhanced deposition of tetraethyl orthosilicate (PETEOS), a nitride layer formed by plasma-enhanced chemical vapor deposition (PECVD), or a spin-on glass (SOG) layer;

Formation of a gate photoresist to allow selective etching of the gate hard mask, etching of the hard mask, and removal of the photoresist;

Etching of refractory silicide layer 34 and silicon regions 31, 32, 33;

Formation of a photoresist to allow implantation of a low-doped drain region (LDD), implanting of the LDD, and removal of the photoresist;

Deposit of a dielectric, e.g., silicon oxide by PETEOS, for gate spacer formation, anneal of the dielectric, and etch of the spacers;

Formation of a photoresist to allow implantation of n-type source and drain, implanting the n-type source and drain, and removal of the photoresist;

Formation of a photoresist to allow implantation of p-type source and drain, implanting the p-type source and drain, and removal of the photoresist.

The rapid thermal anneal is advantageously performed subsequent to implantation of the p-type source and drain. Where a salicide process is used, the process is typically performed subsequent to formation of the n-type and p-type source and drain, and the rapid thermal anneal is typically performed prior to depositing the refractory metal on the polysilicon gate structure.

The invention will be further clarified by the following examples:

EXAMPLE 1

A silicon wafer was processed using conventional expedients, well known in the art, to form a silicon substrate having lightly doped n-type and p-type regions. A field dielectric region was grown on a selected portion of the substrate by the shallow trench isolation (STI) technique to electrically isolate the n-type and p-type regions. A 30 Å gate dielectric layer of silicon oixynitride was then formed on the portions of the substrate not covered by the field dielectric region by thermal oxidation in $N_2O$ at 850° C. A 100 Å thick layer of undoped amorphous silicon was then formed over the field and gate dielectric layers by low pressure chemical vapor deposition, followed by deposition of 400 Å thick in situ phosphorous doped ($Si_2H_6$ and $PH_3$) film. A layer of photoresist, in accordance with standard practice, was formed on the silicon and patterned to expose portions of the silicon overlying the lightly doped n-type region of the substrate. The exposed portions were then reactively ion etched until the doped portion of the polysilicon layer was removed. The photoresist was removed and a second amorphous silicon layer having a thickness of 500 Å was formed by low pressure chemical vapor deposition and implanted with B atoms (energy: 2KeV, dose: $3 \times 10^{15}$/cm$^2$). The wafer was then planarized using RODEL SDE3000 polysilicon slurry, until the silicon thickness was reduced to about 500–600 Å. This was followed by a deposition of an additional 500 Å thick undoped amorphous silicon layer by low pressure chemical upon deposition. An anneal was then performed at 650 ° C. for 3 hours in nitrogen atmosphere to crystallize the amorphous silicon. After the anneal, a 1000 Å tungsten silicide layer was formed on the second amorphous silicon region by sputtering, and nitrogen was implanted into the silicide at 30 keV and a dosage of $1\times10^{15}$ atoms/cm$^2$. In accordance with the standard processing steps discussed above, gate stacks were formed. Specifically, a 1500 Å silicon dioxide hard mask was formed on the silicide layer by PETEOS; the mask was etched; the silicide and silicon regions were etched; a low-doped drain region of arsenic was implanted; a silicon dioxide layer was formed for gate spacers and the spacers were etched; an anneal was performed at 750° C. for 30 minutes in oxygen to densify the silicon dioxide spacers; n-type drain and source were implanted; and p-type drain and source were implanted. Then a rapid thermal anneal of the wafer was performed, the wafer being heated at 1000° C. for 5 seconds in an RTA tool.

It is to be understood that the above-described embodiments are illustrative of only a few of the many possible specific embodiments which can represent applications of the principles of the invention. Numerous and varied other arrangements can be devised by those skilled in the art without departing from the spirit and scope of the invention.

What is claimed is:

1. A process of fabricating a dual gate structure for a CMOS device comprising the steps of:

providing a semiconductor workpiece comprising a semiconductor substrate having a surface comprising a first region of a first type of conductivity, an adjacent second region of a second type of conductivity, and an overlying gate dielectric layer;

forming on said gate dielectric layer, overlying said first and second regions, a first layer of semiconductor doped to said first type of conductivity;

selectively removing the portion of the first layer of semiconductor overlying said first region;

forming overlying said first and second regions, a second layer of semiconductor doped to said second conductivity type; and planarizing the first and second layers to remove the portion of the second layer overlying the second region so that the first layer over the second region and the second layer over the first region are of respectively opposite conductivity type.

2. The method of claim 1 wherein said first layer is formed by growing an in situ doped layer.

3. The method of claim 1 further comprising the step of growing an undoped layer of semiconductor on the workpiece after the planarizing step.

4. The method of claim 1 wherein said planarizing is by chemical-mechanical polishing.

5. The process of claim 1 wherein said semiconductor comprises silicon, said first type of conductivity is n-type conductivity and said second type of conductivity is p-type conductivity.

6. The process of claim 3 further comprising the step of forming a metal silicide on the layer of undoped semiconductor.

* * * * *